(12) United States Patent
Huska et al.

(10) Patent No.: US 10,193,031 B2
(45) Date of Patent: Jan. 29, 2019

(54) METHOD FOR APPLYING PHOSPHOR TO LIGHT EMITTING DIODES AND APPARATUS THEREOF

(71) Applicant: Rohinni, LLC, Coeur d' Alene, ID (US)

(72) Inventors: Andrew Huska, Liberty Lake, WA (US); Cody Peterson, Hayden, ID (US); Clinton Adams, Coeur d' Alene, ID (US); Monica Hansen, Santa Barbara, CA (US)

(73) Assignee: Rohinni, LLC, Coeur d'Alene, ID (US)

( * ) Notice: Subject to any disclaimer, the term of this patent is extended or adjusted under 35 U.S.C. 154(b) by 0 days.

(21) Appl. No.: 15/456,435

(22) Filed: Mar. 10, 2017

(65) Prior Publication Data

US 2017/0263826 A1    Sep. 14, 2017

Related U.S. Application Data

(60) Provisional application No. 62/307,232, filed on Mar. 11, 2016.

(51) Int. Cl.
*H01L 33/50* (2010.01)
*H01L 25/075* (2006.01)
*H01L 33/46* (2010.01)

(52) U.S. Cl.
CPC ........ *H01L 33/505* (2013.01); *H01L 25/0753* (2013.01); *H01L 33/46* (2013.01); *H01L 33/501* (2013.01); *H01L 2933/005* (2013.01); *H01L 2933/0033* (2013.01); *H01L 2933/0041* (2013.01)

(58) Field of Classification Search
CPC .......................... H01L 25/0753; H01L 33/46
See application file for complete search history.

(56) References Cited

U.S. PATENT DOCUMENTS

| 5,813,753 A | 9/1998 | Vriens et al. |
| 5,959,316 A | 9/1999 | Lowery |

(Continued)

FOREIGN PATENT DOCUMENTS

| CN | 101761810 | 6/2010 |
| CN | 104235682 | 12/2014 |

(Continued)

OTHER PUBLICATIONS

Le Quartz, "LED Phosphors and Down-Converters Patent Investigation", retrieved on Jan 8, 2016, at <<www.yole.fr>>, 22 pages.

(Continued)

*Primary Examiner* — Caridad Everhart
*Assistant Examiner* — Ankush Singal
(74) *Attorney, Agent, or Firm* — Lee & Hayes, P.C.

(57) ABSTRACT

A method of applying phosphor to an unpackaged Light-Emitting Diode (LED) die includes transferring the unpackaged LED die directly to a product substrate; disposing a coverlay on the product substrate to create a cavity around the unpackaged LED die; and applying phosphor to substantially fill the cavity around the unpackaged LED die, the applying including at least one of using a squeegee to place the phosphor into the cavity, spraying the cavity with the phosphor, or disposing the phosphor in a sheet form onto the unpackaged LED die.

10 Claims, 8 Drawing Sheets

(56) References Cited

U.S. PATENT DOCUMENTS

| | | | |
|---|---|---|---|
| 6,653,765 B1* | 11/2003 | Levinson | H01L 33/507 257/E33.074 |
| 7,108,386 B2 | 9/2006 | Jacobson et al. | |
| 7,344,952 B2 | 3/2008 | Chandra | |
| 7,626,210 B2 | 12/2009 | Shchekin et al. | |
| 8,232,117 B2 | 7/2012 | Basin et al. | |
| 8,637,883 B2* | 1/2014 | Chakraborty | H01L 33/44 257/100 |
| 8,860,056 B2 | 10/2014 | Tseng et al. | |
| 9,287,469 B2* | 3/2016 | Chakraborty | H01L 33/501 |
| 2002/0180351 A1* | 12/2002 | McNulty | B82Y 20/00 313/512 |
| 2005/0224821 A1* | 10/2005 | Sakano | B29C 67/08 257/79 |
| 2006/0289884 A1 | 12/2006 | Soules et al. | |
| 2008/0173884 A1 | 7/2008 | Chitnis et al. | |
| 2011/0014464 A1 | 1/2011 | Tu | |
| 2011/0148279 A1 | 6/2011 | Li et al. | |
| 2011/0309390 A1* | 12/2011 | Liu | H01L 25/0753 257/89 |
| 2012/0142124 A1 | 6/2012 | Yoo et al. | |
| 2012/0155061 A1* | 6/2012 | Manabe | F21V 3/04 362/84 |
| 2012/0217496 A1* | 8/2012 | Tischler | H01L 23/4985 257/43 |
| 2012/0256215 A1* | 10/2012 | Liou | H01L 33/58 257/98 |
| 2012/0305956 A1 | 12/2012 | Liu et al. | |
| 2012/0313120 A1* | 12/2012 | Bisberg | H01L 33/505 257/88 |
| 2013/0264601 A1 | 10/2013 | Matsumura et al. | |
| 2014/0021502 A1* | 1/2014 | Shimizu | H01L 33/501 257/98 |
| 2015/0111328 A1* | 4/2015 | Huang | H01L 33/50 438/27 |
| 2015/0353740 A1* | 12/2015 | Kojima | F21V 19/001 362/296.04 |
| 2016/0020368 A1 | 1/2016 | Kanemaru | |
| 2017/0040499 A1* | 2/2017 | Ushiyama | H01L 33/502 |
| 2017/0236760 A1* | 8/2017 | Chen | H01L 22/14 257/88 |

FOREIGN PATENT DOCUMENTS

| | | |
|---|---|---|
| WO | WO2007049187 | 5/2007 |
| WO | WO2011135528 | 11/2011 |

OTHER PUBLICATIONS

PCT Search Report and Written Opinion dated Aug. 14, 2017 for PCT Application No. PCT/US17/21988, 10 pages.

* cited by examiner

METHOD FOR APPLYING PHOSPHOR TO LIGHT EMITTING DIODES AND APPARATUS THEREOF

RELATED APPLICATIONS

This application is related to and claims priority from U.S. Provisional Patent Application No. 62/307,232, filed Mar. 11, 2016, entitled "Applying Phosphor to Unpackaged Light Emitting Diodes," the entire contents of which are incorporated herein by reference. This application is further related to U.S. patent application Ser. No. 14/939,896, filed Nov. 12, 2015, entitled "Apparatus for Transfer of Semiconductor Devices," the entire contents of which are incorporated herein by reference.

BACKGROUND

Light-Emitting Diodes (LEDs) are increasingly being used in today's society. Many implementations use LEDs that naturally emit blue light. To obtain a white light, which is desired in many applications, the LEDs may be coated with a yellow phosphor. The phosphor may be packaged as a powder and integrated into a carrier material that is applied to the LEDs. Through fluorescence, the phosphor absorbs some of the blue light emitted from the LEDs and emits light of a longer wavelength, ultimately producing white light. In many instances, current techniques for applying phosphor to LEDs are complicated, costly, and/or result in relatively large increases to the thickness of the LEDs.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

Figure 1A:
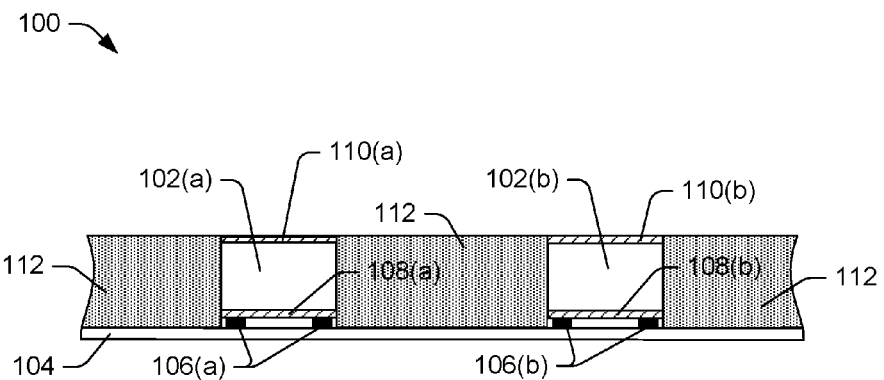
FIG. 1A illustrates an example LED system with phosphor applied to the sides of LED die.

This disclosure describes techniques and products directed to applying phosphor to unpackaged LEDs. An "unpackaged" LED may refer to an unenclosed LED without protective features. For example, an unpackaged LED may refer to an LED die that does not include a plastic or ceramic enclosure, pins/wires connected to die contacts (e.g., for interfacing/interconnecting with ultimate circuitry), and/or a sealing (e.g., to protect the die from the environment). The techniques described herein may apply phosphor to an unpackaged LED in a variety of manners. For example, phosphor may be sprayed onto the LED, squeegeed into a cavity that surrounds the LED, adhered to the LED in a sheet form, printed onto the LED, or applied in other manners. In some instances, the phosphor may be applied to a top surface of the LED, sides of the LED, and/or a bottom of the LED.

In many instances, the techniques discussed herein are implemented at the product level (after LEDs are disposed on a "product substrate"). The term "product substrate" may include, but is not limited to: a wafer tape (for example, to presort the die and create sorted die sheets for future use); a paper or polymer substrate formed as a sheet or other non-planar shape, where the polymer—translucent or otherwise—may be selected from any suitable polymers, including, but not limited to, a silicone, an acrylic, a polyester, a polycarbonate, etc.; a circuit board (such as a printed circuit board (PCB)); a string or thread circuit, which may include a pair of conductive wires or "threads" extending in parallel; and a cloth material of cotton, nylon, rayon, leather, etc. As such, phosphor may be applied in a chip-on-board (COB) context, chip-on-flex context, and so on. The choice of material of the product substrate may include durable materials, flexible materials, rigid materials, and/or other materials which maintain suitability for the end use of the product substrate. The product substrate may be formed solely or at least partially of conductive material such that the product substrate acts as a conductive circuit for forming a product. The potential types of product substrate may further include items, such as glass bottles, vehicle windows, or sheets of glass. In one example, a product substrate may be a flexible, translucent polyester sheet having a desired circuit pattern screen printed thereon using a silver-based conductive ink material to form a circuit trace. In some instances, the thickness of the product substrate may be range from about 5 microns to about 80 microns, from about 10 microns to about 80 microns, from about 10 microns to about 100 microns, and larger.

Further, in many instances the techniques discussed herein are implemented in the context of a "direct transfer" process, where an unpackaged LED die is transferred from a wafer or wafer tape directly to a product substrate, such as a circuit substrate, and then phosphor is applied to the LED die on the product substrate. The direct transfer of the unpackaged LED die may significantly reduce the thickness of an end product (in comparison to other techniques), as well as the amount of time and/or cost to manufacture the product substrate. In an embodiment, the direct transfer process may include methods, and may be performed by machines, such as those described in U.S. patent application Ser. No. 14/939,896.

The fabrication of LEDs typically involves an intricate manufacturing process with a myriad of steps. The fabrication may start with handling a semiconductor wafer. The wafer is diced into a multitude of "unpackaged" LED devices. The "unpackaged" modifier refers to an unenclosed LED device without protective features. An unpackaged LED device may be referred to as an LED die, or just "die." A single semiconductor wafer may be diced to create multiple die of various sizes, so as to form upwards of more than 100,000 or even 1,000,000 die from the semiconductor wafer. The unpackaged die are then "packaged." The "packaged" modifier may refer to the enclosure and protective features built into the final product as well as the interface that enables the die in the package to be incorporated into an ultimate circuit. For example, packaging may involve mounting a die into a plastic-molded lead frame or onto a ceramic substrate, connecting the die contacts to pins/wires for interfacing/interconnecting with ultimate circuitry, and sealing the die with an encapsulant to protect it from the environment (e.g., dust). A product manufacturer then places packaged LEDs in product circuitry. Due to the packaging, the LED die are ready to be "plugged in" to the circuit assembly of the product being manufactured. Additionally, while the packaging of the LED die protects them from elements that might degrade or destroy the devices, the packaged LED die are inherently larger (e.g., in some cases, around 10 times the thickness and 10 times the area, resulting in 100 times the volume) than the die found inside the package. Thus, the resulting circuit assembly cannot be any thinner than the packaging of the LED die.

To address these issues, in many instances the techniques discussed herein implement a "direct transfer" process where an LED die is transferred directly from a wafer or wafer tape to a product substrate. Thereafter, phosphor may be applied to the LED die. This may allow the LED die to be transferred to an end-product in an unpackaged form. Although in other instances, the techniques may be implemented in other contexts that do not implement a direct transfer process.

The techniques and/or products discussed herein provide a variety of advantages. For example, the techniques may apply phosphor to particular surfaces of an LED and/or within the context of particular structures described herein. Additionally, or alternatively, the techniques may apply phosphor to unpackaged LEDs and/or at the product level. By doing so, the techniques may produce relatively thin white LEDs, reduce manufacturing costs, increase manufacturing speeds, and/or provide a variety of other advantages over current techniques and products.

Although many techniques and products are discussed in the context of LEDs, these techniques and products may additionally, or alternatively, be implemented within other contexts. For example, the techniques and products may be implemented for other types of semiconductor devices including electrically-actuatable elements, such as diodes, transistors, resistors, capacitors, fuses, and so on. Further, the techniques and product may be implemented with other types of coating materials besides phosphor, such as scattering particles (e.g., forward scattering nanoparticles), particles to make a white reflective surface (e.g., on a side of a die) $TiO_2$ or $ZrO_2$ particles, etc.

Further, while many techniques and/or products are discussed herein in the context of "direct phosphor" (e.g., phosphor applied directly to an LED die), in some instances the techniques and/or products may be implemented in the context of remote phosphor or closely coupled phosphor (e.g., with one or more layers of material disposed between phosphor and an LED die).

While embodiments are described herein in language specific to structural features and/or methodological acts, it is to be understood that the disclosure is not necessarily limited to the specific features or acts described. Rather, the specific features and acts are disclosed herein as illustrative forms of implementing the embodiments.

Figure 1B:
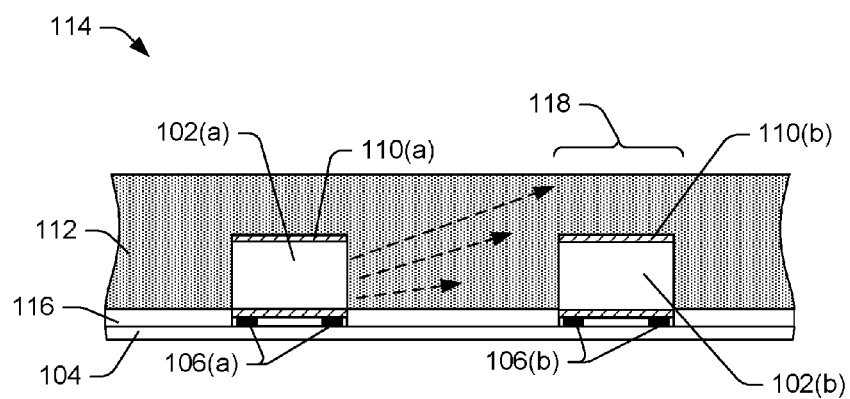
FIG. 1B illustrates an example LED system with phosphor applied on to the sides of LED die, as well as to the tops of the LED die.

FIGS. 1A and 1B illustrate example LED systems with phosphor applied to the sides of the LEDs. For ease of illustration, two LED die are illustrated in FIGS. 1A and 1B (as well as in many other figures), however, any number of LED die may be provided. While various elements (e.g., layers, films, die, circuit traces, etc.) are illustrated in FIGS. 1A and 1B (and other figures), any of such elements may be omitted. Further, any additional elements may be added.

FIG. 1A illustrates an example LED system 100 with phosphor applied to the sides of LED die. In this example, the LED system 100 may use reflective films on a top and/or a bottom of the LED die to reflect light into the phosphor on the sides of the LED die. In instances where the reflective films are semi-reflective, light may additionally be provided out the top of the LED die through the reflective films.

As shown in FIG. 1A, the LED system 100 includes a first LED die 102(a) and a second LED die 102(b) attached to a substrate 104. In this example, the substrate 104 comprises a product substrate. Although other types of substrates may be used. The LED die 102(a) is attached to the substrate 104 via a circuit trace 106(a), while the LED die 102(b) is attached to the substrate 104 via a circuit trace 106(b). A reflective film 108(a) (e.g., reflector) may be positioned on a bottom of the LED die 102(a), and a reflective film 108(b) (e.g., reflector) may be positioned on a bottom of the LED die 102(b). A reflective film 110(a) (e.g., reflector) may also be disposed on a top of the LED die 102(a), while a reflective film 110(b) (e.g., reflector) may be disposed on a top of the LED die 102(b). Although in other examples, the reflective films 108 and/or 110 may be omitted. The reflective films 108 may be mirror contacts to couple to the circuit traces 106. In this example, the LED die 102 are flip chips with the respective reflective films 108 and 110 deposited on the flip chips before mounting the flip chips to the substrate 104. However, in other instances the LED die 102 may be other types of LEDs. Further, the reflective films 108 and/or 110 may be deposited at any time (e.g., the circuit traces 106 may be disposed on the substrate 104, the reflective films 108 may be deposited around the circuit traces 106, and then the LED die 102 may be disposed on the circuit traces 106). The LED system 100 may also include phosphor 112 disposed on the substrate 104. While not illustrated, in other embodiments a coverlay may be disposed between the phosphor 112 and the substrate 104.

The circuit traces 106, as depicted, may include a pair of adjacent trace lines spaced apart by a trace spacing, or gap so as to accommodate a distance between electrical contact terminals (not shown) on the LED die 102. For example, the circuit trace 106(a) may be positioned apart from each other by a space that is filled in with the reflective film 108(a). A trace spacing, or gap between the adjacent trace lines of a circuit trace may be sized according to the size of the LED die contacting the circuit trace, to ensure proper connectivity and subsequent activation of the LED die. For example, the circuit trace 106(a) may have a trace spacing, or gap ranging from about 75 to 200 microns, about 100 to 175 microns, or about 125 to 150 microns.

The circuit trace 106 may be formed from a conductive ink disposed via screen printing, inkjet printing, laser printing, manual printing, or other printing means. Further, the circuit traces 106 may be pre-cured and/or semi-dry or dry to provide additional stability, while still being activatable for die conductivity purposes. A wet conductive ink may also be used to form the circuit trace 106, or a combination of wet and dry ink may be used for the circuit traces 106. Alternatively, or additionally, the circuit traces 106 may be pre-formed as a wire trace, or photo-etched, or from molten material formed into a circuit pattern and subsequently adhered, embedded, or otherwise secured to the substrate 104.

The material of the circuit traces 106 may include, but is not limited to, silver, copper, gold, carbon, conductive polymers, etc. In some instances, the circuit traces 106 may include a silver-coated copper particle. A thickness of the circuit traces 106 may vary depending on the type of material used, the intended function, the appropriate strength or flexibility to achieve that function, the energy capacity, the size of the LED die, etc. For example, a thickness of the circuit trace may range from about 5 microns to 20 microns, from about 7 microns to 15 microns, or from about 10 microns to 12 microns.

In the example of FIG. 1A, the LED die 102 comprise unpackaged LED die that are extremely small. For example, a thickness (e.g., height) of an LED die may range from 12.5 to 200 microns, from 25 to 100 microns, from 50 to 80 microns, and so on. In some instances, materials used for an LED die may include, but are not limited to, silicon carbide (SiC), III-nitrides (e.g., gallium nitride (GaN), indium gallium nitride (InGaN), etc.), III-phosphides (e.g., aluminum gallium indium phosphide (AlGaInP)), III-arsenides (e.g., aluminum gallium arsenide (AlGaAs)), a coated silicon oxide, etc. As one example, an LED die may be made with gallium nitride (GaN) or indium gallium nitride (InGaN) to emit blue light.

The reflective films 108 and/or 110 may be composed of metals, such as aluminum (Al), silver (Ag), titanium dioxide ($TiO_2$), zirconium dioxide ($ZrO_2$), and so on. Since metals may not be reflective in every visible wavelength, the type of metal used for the reflective film 108 and/or 110 may depend on the implementation (e.g., for blue LEDs—Al and Ag may provide highly reflectivity metals (about 90-92% reflectivity)). In some instances, the reflective films 108 and/or 110 may be formed via vacuum deposition techniques (e.g. sputtering, thermal evaporation, e-beam evaporation, etc.). In other instances, the reflective films 108 and/or 110 may be sprayed or applied as a sheet. In yet other instances, the reflective films 108 and/or 110 may be formed from a reflective ink disposed via screen printing, inkjet printing, laser printing, manual printing, or other printing means. As one example, a highly reflective white film can be printed based on $TiO_2$ or $ZrO_2$ nanoparticles embedded in spun fiber matrices. In some instances, the reflective films 108 and/or 110 enable at least some light to be emitted through the reflective files 108 and/or 110. For example, the reflective films 108 and/or 110 may reflect more than 50% of light, while allowing the rest of the light to pass through the reflective films 108 and/or 110. In other instances, the reflective films 108 and/or 110 may reflect close to 100% of light (e.g., 97-98% reflective, 97% or more reflective, etc.).

In some implementations, the reflective films 108 and/or 110 are used inside LED luminaires to prevent the light from the LEDs from being absorbed by green PCBs or metal heat-sinks.

The phosphor 112 may be composed of silicates, garnets (e.g., Yttrium Aluminum Garnet (YAG)), nitrides, oxynitrides, and so on. Although the phosphor 112 is referred to in many instances herein as simply "phosphor," the phosphor 112 may actually be composed of a carrier material (e.g., silicone) that has phosphor powder integrated therein. The phosphor 112 may be applied through a variety of processes, such as printing, squeegeeing, spraying, and so on. In some instances, the phosphor 112 may extend from the side of the LED die 102 by a substantial amount. For example, the phosphor 112 may extend from a side of the LED die 102(a) more than a height of the LED die 102(a), more than twice the height of the LED die 102(a), more than a width of the LED die 102(a), more than twice the width the of LED die 102(a), and so on. In some examples, the phosphor 112 may extend to the side of the LED die 102(a) more than 80 microns, more than 100 microns, more than 150 microns, more than 200 microns, etc.

As one example of forming the LED system 100 of FIG. 1A, the circuit traces 106 may be disposed on the substrate 104 via a printing process. The LED die 102 (with the reflective films 108 and/or 110 already attached to the LED die 102) may be attached to the circuit traces 106 (e.g., through a direct transfer process or otherwise). The phosphor 112 may then be applied through printing, squeegeeing, spraying, etc. By forming the phosphor 112 on the sides of the LED die 102 (and/or by using the reflective films 108 and/or 110), the LED system 100 may provide light in a substantially horizontal manner. This may be useful in many applications including edge-lit display panels (e.g., Liquid Crystal Displays (LCDs)), and so on. Further, in many instances the phosphor 112 may assist in diffusing light emitted from the LED die 102 to create a more uniform light source (e.g., by scattering light rays to provide less direction light).

FIG. 1B illustrates an example LED system 114 with phosphor applied to the sides of LED die, as well as to the tops of the LED die. In particular, the structure of the LED system 114 is the same as that of the structure of the LED system 100 discussed above in reference to FIG. 1A, except that the LED system 114 includes the phosphor 112 over the tops of the LED die 102 (e.g., over the reflective films 110) and the LED system 114 includes a coverlay 116 (described hereafter). The phosphor 112 may be applied as a single piece (as illustrated), or in separate pieces. In many instances, by providing the phosphor 112 on the tops of the LED die 102, light from one of the LED die 102 is able to better reach a dead spot above one of the other LED die 102. For example, light emitted from the LED die 102(a) may travel through the phosphor 112 to reach a dead spot 118 above the LED die 102(b), ultimately creating a more uniform light source. That is, light emitted from the LED system 114 may be more uniform across the LED die 102 and avoid bright points of light. Although not illustrated in FIG. 1A, in some instances the coverlay 116 may be applied in a similar fashion as that shown in FIG. 1B.

Figure 2A:
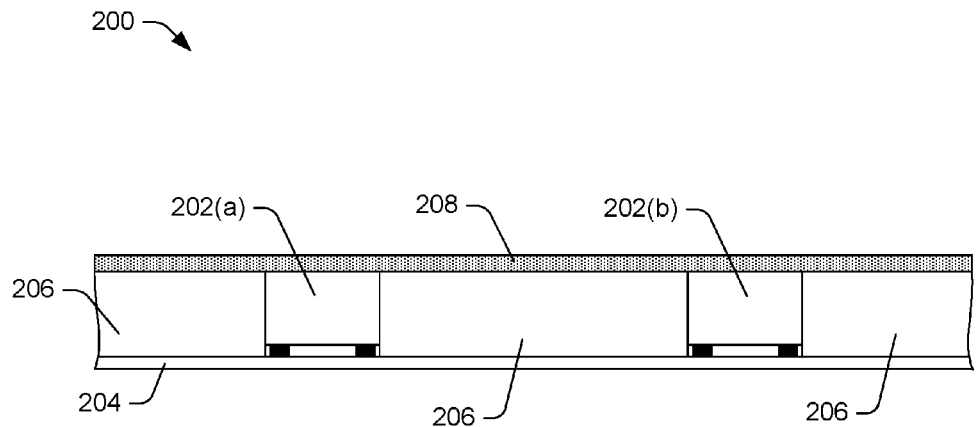
FIG. 2A illustrates an example LED system with a substantially planar sheet of phosphor.
Figure 2B:
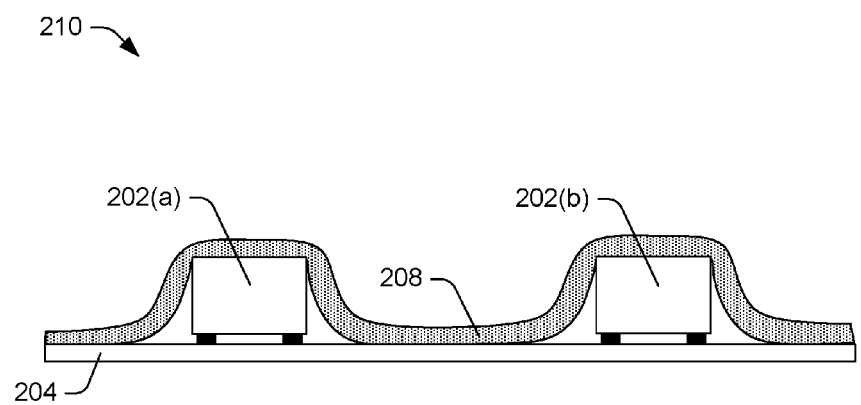
FIG. 2B illustrates an example LED system with a non-planar sheet of phosphor.

FIGS. 2A and 2B illustrate example LED systems with sheets of phosphor applied to LED die. A sheet of phosphor may generally include a carrier material (e.g., silicone) with phosphor particles disposed therein, such as phosphor powder. A sheet of phosphor may be attached to a top of an LED die with adhesive, through heating the sheet of phosphor, a combination thereof, and/or through other means.

FIG. 2A illustrates an example LED system 200 with a substantially planar sheet of phosphor. In particular, the LED system 200 includes an LED die 202(a) and an LED die 202(b) disposed on a substrate 204 (e.g., a product substrate). The LED system 200 also includes a coverlay 206 disposed on the substrate 204 to create a substantially planar surface with the tops of the LED die 202. As illustrated, a sheet of phosphor 208 is disposed on the substantially planar surface such that the sheet of phosphor 208 is attached to the tops of the LED die 202 and to the coverlay 206.

The coverlay 206 may generally provide a protective surface and/or structure for the substrate 204 and/or other elements of the LED system 200. The coverlay 206 may be composed of silicone, plastic (e.g., thin plastic sheet), polyester, polycarbonate, polyethylene (PE), polyethylene terephthalate (PET), polyimide (PI), etc. The coverlay 206 may be formed as a Liquid Photo Ink (LPI) that is printed. In some instances, the coverlay 206 is composed of a non-conductive material, while in other instances the coverlay 206 is composed of a conductive or semi-conductive material. Further, in some instances the coverlay 206 is composed of a transparent material or semi-transparent material (e.g., clear film), while in other instances the coverlay 206 is composed of a non-transparent (opaque) material (e.g., color of base material, black, white reflective, etc.). The thickness of the coverlay 206 may range from 5 to 80 microns, 10 to 80 microns, 10 to 100 microns, and so on.

FIG. 2B illustrates an example LED system 210 with a non-planar sheet of phosphor. Here, the sheet of phosphor 208 is applied to the LED die 202 without the coverlay 206. That is, the LED system 210 does not include the coverlay 206 of FIG. 2A. In this example, the sheet of phosphor 208 is disposed on the tops of the LED die 202 in a substantially planar form and then heat is applied to form the sheet of phosphor 208 to the LED die 202. As shown, the heat has molded the sheet of phosphor 208 to the LED die 202 (e.g., in a shrink wrap manner), so that the sheet of phosphor 208 extends from the tops of the LED die 202 to at least a part of the sides of the LED die 202. As also illustrated, the sheet of phosphor 208 is attached to the substrate 204 (e.g., directly contacts the substrate 204). Although illustrated in FIG. 2B without adhesive, in some instances adhesive is provided between the LED die 202 and the sheet of phosphor 208.

Figure 3A:
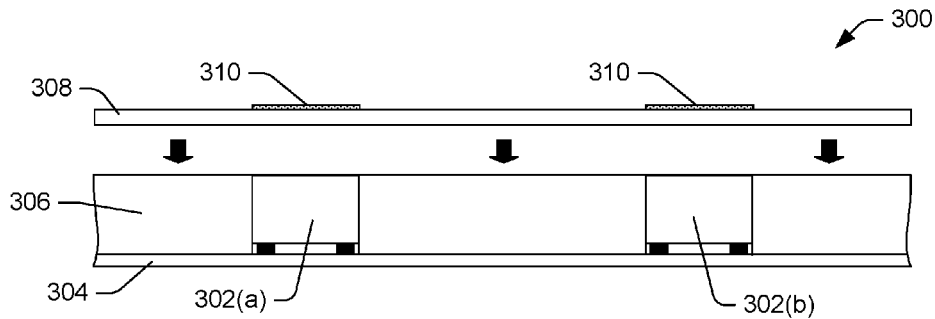
FIG. 3A illustrates a side view of an example LED system with phosphor applied to a sheet of material that is attached to LED die.
Figure 3B:
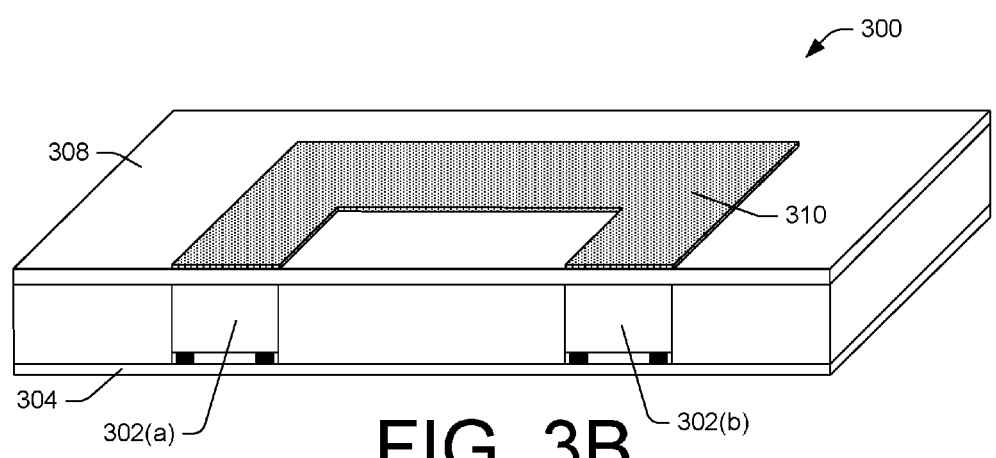
FIG. 3B illustrates a perspective view of the example LED system of FIG. 3A.
Figure 3C:
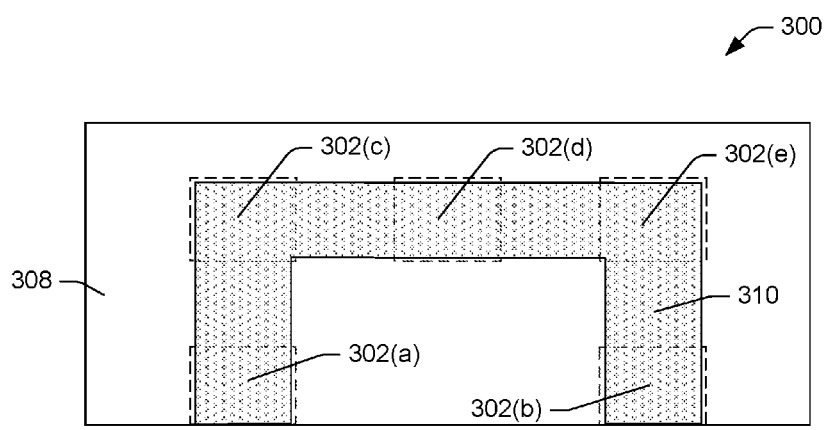
FIG. 3C illustrates a top view of the example LED system of FIG. 3A.

FIGS. 3A, 3B, and 3C illustrate an example LED system with phosphor applied to a sheet of material and the sheet of material being attached to LED die. In some instances, this may be implemented in a remote phosphor context (e.g., where phosphor is removed from direct contact with an LED die) and/or a closely coupled remote phosphor context (e.g., where phosphor is removed from direct contact with the LED die but within a relatively close distance to the LED die, such as 10-50 microns).

FIG. 3A illustrates a side view of an example LED system 300 with phosphor applied to a sheet of material that is attached to LED die. In particular, the LED system 300 includes an LED die 302(a) and an LED die 302(b) attached to a substrate 304 (e.g., product substrate). As shown, a coverlay 306 is disposed on the substrate 304 to create a substantially planar surface with the tops of the LED die 302. FIG. 3A also shows a sheet of material 308 with phosphor 310 disposed on a top surface of the sheet of material 308. For example, the phosphor 310 may be printed on the sheet of material 308 before the sheet of material 308 is attached to the LED die 302. The sheet of material 308 may be composed of any type of material, such as a transparent material, semi-transparent material, and so on. In one example, the sheet of material 308 is composed of silicone. Alternatively, or additionally, the sheet of material 308 may include a polymer (e.g., an epoxy). The phosphor 310 may be printed in a same pattern as the LED die 302 are located on the substrate 304. The sheet of material 308 may then be placed on the LED die 302 with the phosphor 310 aligned with the LED die 302 (e.g., so that the phosphor 310 is above the LED die 302), thereby allowing light emitted from the LED die 302 to travel through the phosphor 310 and create white light. Although the phosphor 310 is illustrated as being located on a top surface of the sheet of material 308, in some instances the phosphor 310 may be embedded into the sheet of material 308, disposed on a bottom surface of the sheet of material 308, and/or disposed in a cavity of the sheet of material 308 to create a substantially planar surface with the sheet of material 308.

FIG. 3B illustrates a perspective view of the example LED system 300, while FIG. 3C illustrates a top view of the example LED system 300. FIGS. 3B and 3C show how the phosphor 310 is formed in a particular pattern on the sheet of material 308 (e.g., according to the pattern of the LED die 302). In particular, FIG. 3C shows other LED die 302(c), 302(d), and 302(e) located on the substrate 304 in a particular arrangement. The sheet of material 308 is aligned with the LED die 302 so that the phosphor 310 substantially covers the tops of the LED die 302, although not directly contacting the LED die 302.

Figure 4A:
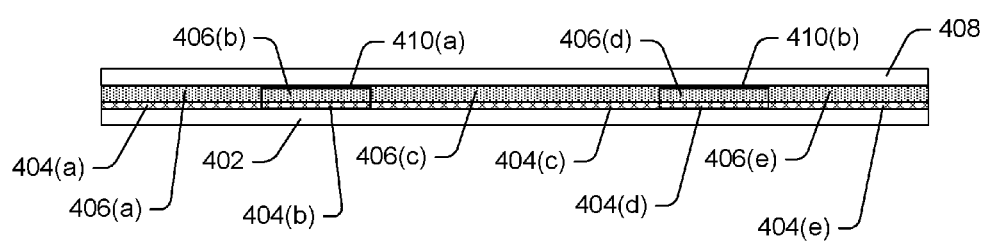
FIG. 4A illustrates an example adhesive tape in a connected form.
Figure 4B:
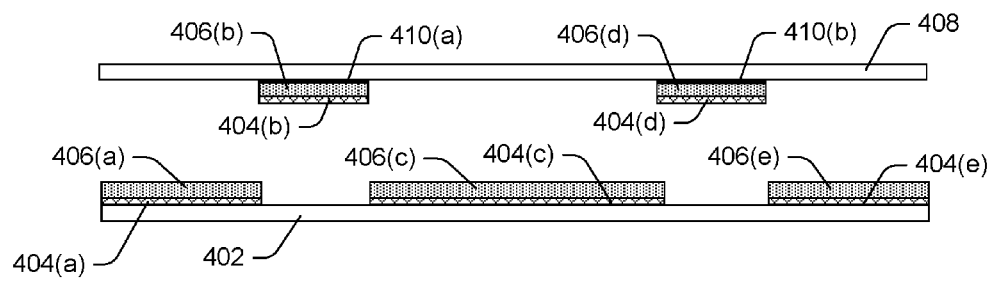
FIG. 4B illustrates an example adhesive tape in a released form.

FIGS. 4A and 4B illustrate an example adhesive tape for applying phosphor. As discussed in detail below, the adhesive tape may include a layer of phosphor that may be removed from the rest of the layers of the adhesive tape and subsequently disposed on LED die.

FIG. 4A illustrates an example adhesive tape 400 in a connected form. In particular, the adhesive tape 400 includes a first release substrate 402, an adhesive layer 404 attached to the first release substrate 402, a phosphor layer 406 attached to the adhesive layer 404, and a second release substrate 408 attached to the phosphor layer 406. The first release substrate 402 and/or the second release substrate 408 may be composed of various materials, such as fluororesin (e.g., ethylene/tetrafluoroethylene copolymers). In some instances, the first release substrate 402 and/or the second release substrate 408 may protect the rest of the adhesive tape 400 during storage and/or at other times. Meanwhile, the phosphor layer 406 may be composed of a carrier material (e.g., silicone) with phosphor particles embedded therein. Further, the adhesive layer 404 may be composed of a silicone based adhesive, solid sheet of thermoset adhesive, liquid adhesive (e.g., screen print), etc.

Figure 5A:
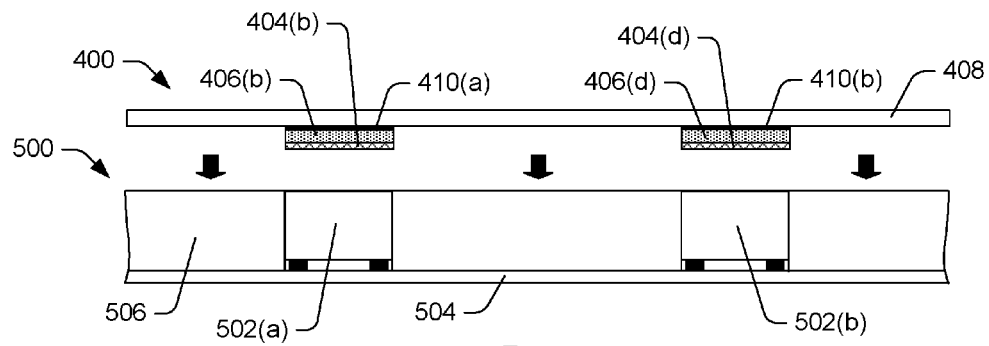
FIG. 5A illustrates a release substrate removed from an adhesive tape along with adhesive cutouts and phosphor cutouts.
Figure 5B:
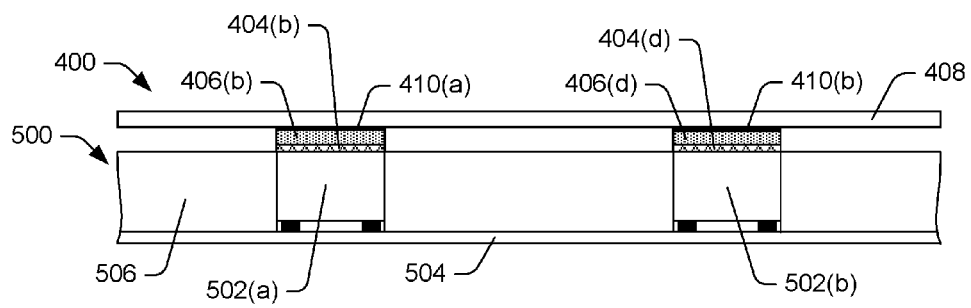
FIG. 5B illustrates a release substrate disposed on an LED system.
Figure 5C:
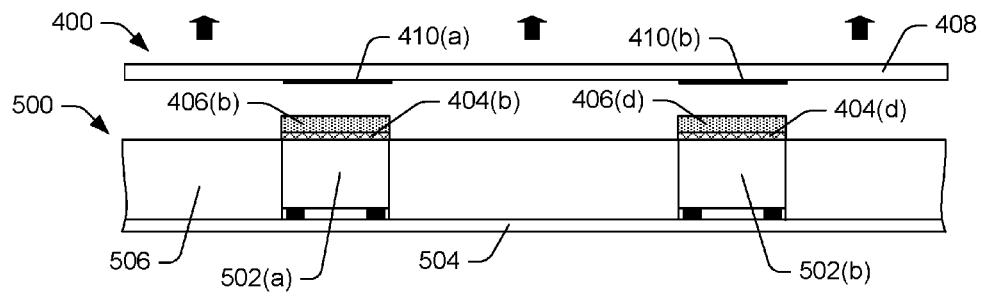
FIG. 5C illustrates a release substrate being removed from an LED system.

The second release substrate 406 may detach from the rest of the adhesive tape 400 with a portion of the phosphor layer 406 and a portion of the adhesive layer 404, as shown in FIG. 4B. This may enable phosphor to be applied to LED die. In particular, the second release substrate 408 may detach from the rest of the adhesive tape 400 with phosphor cutouts 406(b) and 406(d) of the phosphor layer 406 and adhesive cutouts 404(b) and 404(d) of the adhesive layer 404. As such, the second release substrate 408 may be detachably connected to the phosphor layer 406 to release the phosphor cutouts 406(b) and 406(d) and the adhesive cutouts 404(b) and 404(d) from the rest of the adhesive tape 400. The adhesive cutouts 404(b) and 404(d) may assist in attaching the phosphor cutouts 406(b) and 406(d) to LED die, as shown in FIGS. 5A-5C. In this example, the phosphor cutouts 406(b) and 406(d) are connected to the second release substrate 408 with adhesive 410(a) and 410(b), respectively. The adhesive 410 may be similar to the adhesive layer 404 or may be different. However, in other examples, the adhesive 410 may not be provided and the phosphor cutouts 406(b) and 406(d) may attach directly to the second release substrate 408.

While the adhesive layer 404 is shown in FIGS. 4A and 4B (and in other figures), in some instances the adhesive layer 404 may be omitted and the phosphor layer 406 may be attached directly to the first release substrate 402. Here, when the phosphor cutouts 406(b) and 406(d) are removed from the adhesive tape 400 and placed on LED die, the phosphor cutouts 406(b) and 406(d) may attach directly to the LED die by applying heat or by other methods. In one example without an adhesive layer, various layers of the adhesive tape 400 may be printed with a Liquid Photo Ink (LPI).

Further, while the phosphor layer 406 is shown in FIGS. 4A and 4B (and in other figures) as being composed of a uniform material, in some instances this may not be the case. For example, the portions 406(a), 406(c), and 406(e) of the phosphor layer 406 may be composed of a first type of material, such as a non-phosphor material (e.g., silicone), and the portions 406(b) and 406(d) of the phosphor layer 406 may be composed of a second type of material, such as a phosphor-based material (e.g., silicone with phosphor powder). The portions 406(b) and 406(d) of the phosphor layer 406 may be deposited with printing, spraying, squeegeeing, and so on. By including two or more types of materials in the phosphor layer 406, phosphor waste associated with discarding the portions 406(a), 406(c), and 406(e) of the phosphor layer 406 may be reduced.

FIGS. 5A-5C illustrate an example process of applying phosphor to LED die with the adhesive tape 400 of FIGS. 4A and 4B.

In particular, FIG. 5A shows the second release substrate 408 removed from the rest of the adhesive tape 400 along with the adhesive cutouts 404(b) and 404(d), the phosphor cutouts 406(b) and 406(d), and the adhesive 410(a) and 410(b). For ease of description in FIGS. 5A-5C, the second release substrate 408, the adhesive cutouts 404(b) and 404(d), the phosphor cutouts 406(b) and 406(d), and the adhesive 410(a) and 410(b) will be collectively referred to as "the released portion of the adhesive tape 400." As illustrated in FIG. 5A, the released portion of the adhesive tape 400 may be aligned to an LED system 500 that includes LED die 502 mounted on a substrate 504 and a coverlay 506 attached to the substrate 504. The released portion of the adhesive tape 400 may be aligned so that the phosphor cutouts 406(b) and 406(d) are positioned in line with the LED die 502. The released portion of the adhesive tape 400 may then be disposed on the LED system 500, as illustrated in FIG. 5B. In many instances, the adhesive cutouts 404(b) and 404(d) may attach the phosphor cutouts 406(b) and 406(d) to the LED die 502(a) and 502(b), respectively. In some embodiments, the released portion of the adhesive tape 400 and/or the LED system 500 may be heated or irradiated with a heat source (e.g., laser) to firmly attach the phosphor cutouts 406(b) and 406(d) to the LED die 502(a) and 502(b). Thereafter, as shown in FIG. 5C, the second release substrate 408 and the adhesive 410(a) and 410(b) may be removed from the LED system 500 leaving the phosphor cutouts 406(b) and 406(d) attached to the LED die 502(a) and 502(b). The second release substrate 408 and/or the adhesive 410(a) and 410(b) may be discarded or used in other processes.

As noted above, although the adhesive cutouts 404(b) and 404(d) and the adhesive 410(a) and 410(b) are illustrated in FIGS. 5A-5C, in many instances such elements may be omitted. As such, in some instances the phosphor cutouts 406(b) and 406(d) may attach directly to the LED die 502(a) and 502(b).

Although FIGS. 5A-5C illustrate phosphor applied to tops of LED die with an adhesive tape, in some instances a stencil process may be used. This process may include providing a stencil over the LED die with cutouts (e.g., openings) in the stencil that are shaped and positioned to tops of the LED die. Phosphor may then be applied with a silicone or other carrier through various processes, such as printing, spraying, etc. Due to the cutouts in the stencil, the phosphor may be applied to only the tops of the LED die, for example. Once the silicone or other carrier has cured, the stencil may be removed, leaving the silicone or other carrier on the tops of the LED die. In such stencil processes, a coverlay may or may not be used.

Figure 6A:
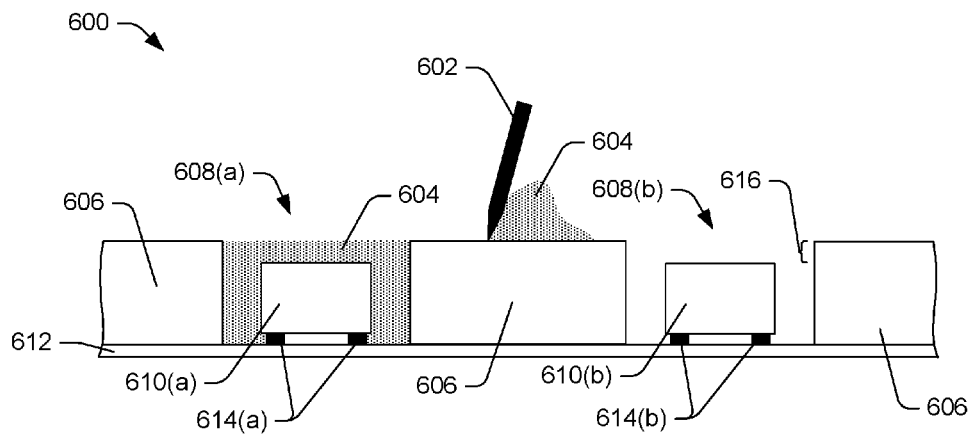
FIG. 6A illustrates an example process of applying phosphor with a squeegee over a coverlay that has substantially vertical walls.
Figure 6B:
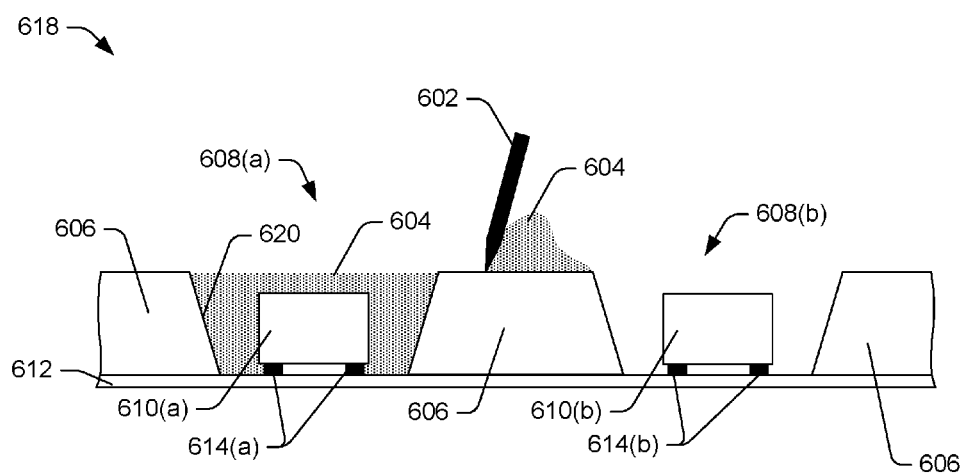
FIG. 6B illustrates an example process of applying phosphor with a squeegee over a coverlay that has diagonal walls.

FIGS. 6A and 6B illustrate example processes of applying phosphor with a squeegee. In these processes, phosphor may generally be applied to a coverlay surrounding an LED die and the squeegee may move across the coverlay to place the phosphor into a cavity around the LED die. The squeegee may comprise any type of tool or element that includes a fine point to contact a surface and move material. The squeegee may be composed of rubber, plastic, metal, or other elements. In some instances, the squeegee is flexible, while in other instances the squeegee may be completely rigid.

FIG. 6A illustrates an example process 600 of applying phosphor with a squeegee over a coverlay that has substantially vertical walls. In particular, a squeegee 602 may move phosphor 604 over a coverlay 606 to fill cavities 608 surrounding LED die 610. Here, the coverlay 606 may extend in a substantially vertical direction (with respect to FIG. 6A) from a substrate 612 to create a surface higher than the LED die 610. Thus, the coverlay 606 may be thicker than the LED die 610 (and circuit traces 614 mounting the LED die 610 to the substrate 612). This may create a gap 616 between a top surface of the LED die 610 and a top surface of the coverlay 606. As shown, the phosphor 604 may be disposed on the coverlay 606 and the squeegee 602 may move the phosphor 604 across the coverlay in a substantially horizontal direction to transfer the phosphor 604 into the cavities 608. This may fill the gap 616 between the top of the LED die 610 and the top of the coverlay 606 to create a substantially planar surface (e.g., on a same plane as the coverlay 606).

FIG. 6B illustrates an example process 618 of applying phosphor with a squeegee over a coverlay that has diagonal walls. Here, the structure of the LED system is the same as that of FIG. 6A, except that the walls of the coverlay 606 are diagonal. For example, wall 620 of the coverlay 606 is tilted away from the LED die 610(a) in a diagonal direction. In some instances, the diagonal walls of the coverlay 606 may provide different reflective characteristics than the vertical walls shown in FIG. 6B. In other examples, the walls of the coverlay 606 may be designed in other fashions to reflect light in different manners.

In the examples of FIGS. 6A and 6B, the coverlay 606 may act as a dam (e.g., barrier) to maintain the phosphor 604 within close proximity to the LED die 610. Further, the coverlay 606 may protect and/or provide rigidity to the substrate 612 and/or other elements. While the coverlay 606 is illustrated as extending between the LED die 610, in some instances the coverlay 606 may merely be provided around the LED die 610. Moreover, in some instances the coverlay 606 may be removed after applying the phosphor 604. Alternatively, or additionally, a stencil may be used (instead of the coverlay 606) to apply the phosphor. The stencil may be placed on the substrate 612 (e.g., through printing or other means) with openings in the stencil aligned with the LED die 610 in a similar fashion as the coverlay 606. Here, the stencil may act as a dam for the phosphor 604. Once the phosphor 604 is applied, the LED system (with the stencil still attached) may be placed in an oven to cure the phosphor 604 (e.g., silicone of the phosphor 604). The LED system may then be removed from the oven and the stencil may be removed from the substrate 612.

Figure 7:
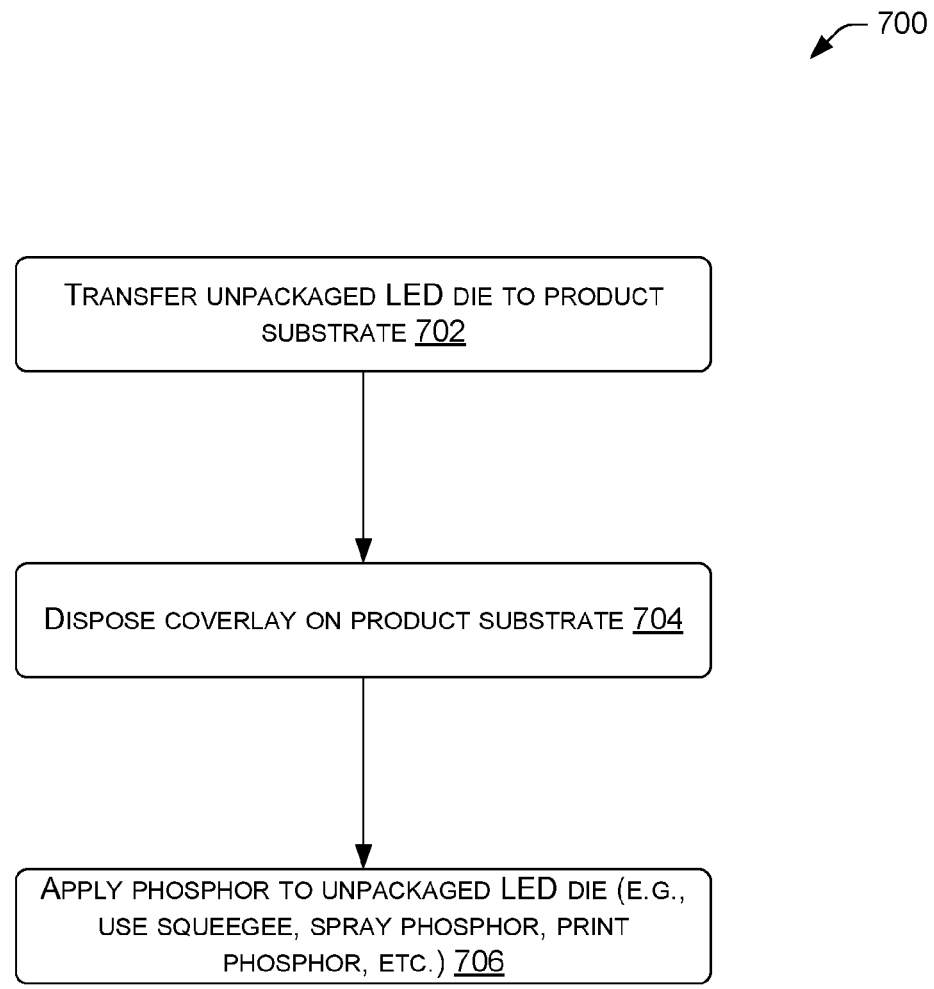
FIG. 7 illustrates an example process for applying phosphor to an unpackaged LED die.

FIG. 7 illustrates an example process 700 for applying phosphor to an unpackaged LED die.

At 702, an unpackaged LED die may be transferred to a product substrate. In some instances, an LED die may be transferred through a process referred to as "direct transfer," while in other instances the LED die may be transferred in another manner (e.g., after being packaged). In a "direct transfer" context, an unpackaged LED die may generally be transferred from a wafer or wafer tape directly to a product substrate.

At 704, a coverlay may be disposed on the product substrate. The coverlay may be disposed through a variety of processes, such as printing, and so on. In some instances, the coverlay is disposed around the unpackaged LED die to create a cavity (e.g., the coverlay does not contact the sides of the unpackaged LED die). Further, in some instances a mask (e.g., stencil) is used with openings for the LED die, such as in cases where the coverlay is sprayed on.

At 706, phosphor may be applied to the unpackaged LED die. This may include using a squeegee to move phosphor into cavities around an unpackaged LED die, spraying phosphor over an LED die, printing phosphor over an LED die (e.g., via screen printing, inkjet printing, laser printing, manual printing, etc.), disposing phosphor in a sheet form on an LED die, using an Ultraviolet (UV) printer to print phosphor dots (e.g., braille-like dots printed with a braille printer), etc. As one example, the applying may include disposing phosphor on a coverlay and moving a squeegee across the coverlay to transfer the phosphor into a cavity around an LED die. In another example, a mask is used with an opening for an LED die and phosphor is sprayed over the mask. In some instances, after applying phosphor to the unpackaged LED die at 706, excess phosphor may be removed (e.g., squeegeeing off excess phosphor, removing a mask layer, etc.), such as phosphor that remains on a coverlay.

Figure 8:
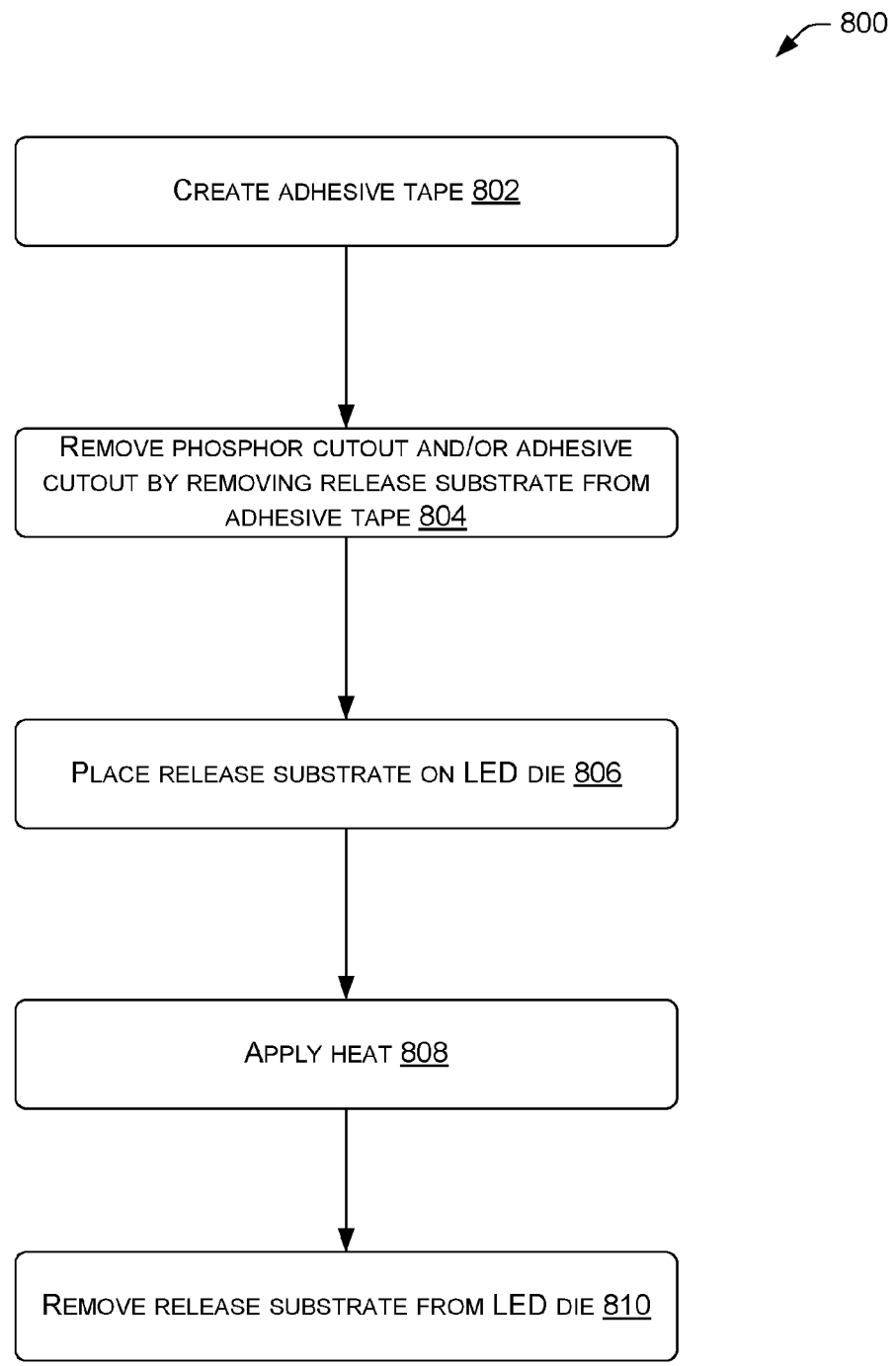
FIG. 8 illustrates an example process for creating a phosphor-based adhesive tape and applying the phosphor-based adhesive to an LED die.

FIG. 8 illustrates an example process 800 for creating a phosphor-based adhesive tape and applying the phosphor-based adhesive to an LED die.

At 802, an adhesive tape may be created. This may include providing a first release substrate, disposing an adhesive layer on the first release substrate, forming an adhesive cutout in the adhesive layer (e.g., through laser cutting, etching etc.), disposing a phosphor layer on the adhesive layer, forming a phosphor cutout in the adhesive layer (e.g., through laser cutting, etching etc.), attaching a second release substrate to the phosphor layer, and so on.

At 804, the phosphor cutout and/or the adhesive cutout may be removed from the adhesive tape. This may include releasing the second release substrate from the adhesive tape, with the phosphor cutout and/or the adhesive cutout attached thereto.

At 806, the second release substrate may be placed on an LED die. This may include aligning the phosphor cutout and/or the adhesive cutout that is on the second release substrate to be in line with the LED die. Although discussed in the context of the second release substrate, in some instances the first release substrate may be removed from the adhesive tape and placed on the LED die.

At 808, heat may be applied to the LED die, the phosphor cutout, and/or the adhesive cutout. This may include placing the elements in an oven. In some instances, operation 808 may be performed when the adhesive cutout is omitted from the implementation, such as in instances where the phosphor is baked onto the LED die. Alternatively, or additionally, operation 808 may include other processes to affix the phosphor cutouts to the LED die, such as irradiating a light source (e.g., laser).

At 810, the second release substrate (or first release substrate in some instances) may be removed from the LED die. This may release the phosphor cutout and/or the adhesive cutout on the LED die. That is, the phosphor cutout and/or the adhesive cutout may remain attached to the LED die while the second release substrate is removed. This process may include pealing the second release substrate from the phosphor cutout and/or the adhesive cutout.

CONCLUSION

Although several embodiments have been described in language specific to structural features and/or methodological acts, it is to be understood that the claims are not necessarily limited to the specific features or acts described. Rather, the specific features and acts are disclosed as illustrative forms of implementing the claimed subject matter. Furthermore, the use of the term "may" herein is used to indicate the possibility of certain features being used in one or more various embodiments, but not necessarily in all embodiments.

What is claimed is:

1. A Light-Emitting Diode (LED) system comprising:
   a substrate;
   an LED die attached to the substrate via a bottom side of the LED die;
   an at least partly reflective film attached to a top side of the LED die; and
   phosphor attached to one or more sides of the LED die via application of a coverlay that forms a cavity around the LED die and the application including at least one of using a squeegee to place the phosphor into the cavity, spraying the cavity with the phosphor, or disposing the phosphor in a sheet form onto the LED die.

2. The LED system of claim 1, wherein the phosphor extends from at least one of the one or more sides of the LED die a distance that is greater than a width of the LED die.

3. The LED system of claim 1, wherein the phosphor extends from at least one of the one or more sides of the LED die between about 5 microns and about 500 microns.

4. The LED system of claim 1, wherein the LED die is a first LED die,
   wherein the LED system further comprises a second LED die attached to the substrate, and
   wherein the phosphor extends from a side of the one or more sides of the first LED die to a side of the second LED die.

5. The LED system of claim 1, wherein the at least partly reflective film reflects more than 30% of light.

6. The LED system of claim 1, wherein the LED die is an unpackaged LED die that is attached directly to the product substrate.

7. The LED system of claim 1, wherein a thickness of the LED die is between about 50 microns and about 80 microns.

8. The LED system of claim 1, wherein the at partly reflective film is a first at least partly reflective film, and wherein the LED system further comprises a second at least partly reflective film positioned between the substrate and the bottom side of the LED die.

9. The LED system of claim 1, wherein the application includes disposing the phosphor in a sheet form, and wherein the sheet of phosphor is attached directly to the top side of the LED die.

10. The LED system of claim 9, wherein the sheet of phosphor is attached to the top side of the LED die with an adhesive.

\* \* \* \* \*